(12) United States Patent
Shirono et al.

(10) Patent No.: US 10,818,501 B2
(45) Date of Patent: Oct. 27, 2020

(54) METHOD FOR MANUFACTURING SEMICONDUCTOR DEVICE

(71) Applicant: Toshiba Memory Corporation, Minato-ku, Tokyo (JP)

(72) Inventors: Takashi Shirono, Yokkaichi Mie (JP); Eiji Takano, Nagoya Aichi (JP); Gen Toyota, Yokkaichi Mie (JP); Eiichi Shin, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/273,123

(22) Filed: Feb. 11, 2019

(65) Prior Publication Data

US 2019/0362980 A1 Nov. 28, 2019

(30) Foreign Application Priority Data

May 24, 2018 (JP) .................. 2018-099668

(51) Int. Cl.
*H01L 21/304* (2006.01)
*H01L 21/306* (2006.01)
*H01L 23/00* (2006.01)

(52) U.S. Cl.
CPC ...... *H01L 21/304* (2013.01); *H01L 21/30625* (2013.01); *H01L 24/27* (2013.01); *H01L 24/32* (2013.01)

(58) Field of Classification Search
None
See application file for complete search history.

(56) References Cited

U.S. PATENT DOCUMENTS

| 2004/0121556 A1 | 6/2004 | Kim et al. |
| 2011/0097874 A1* | 4/2011 | Broekaart ............. H01L 21/304 438/459 |
| 2012/0270394 A1 | 10/2012 | Shih et al. |
| 2014/0284660 A1 | 9/2014 | Makino et al. |

FOREIGN PATENT DOCUMENTS

| JP | H06-77311 A | 3/1994 |
| JP | 4354769 B2 | 10/2009 |
| JP | 2010-205861 A | 9/2010 |
| JP | 2014-120583 A | 6/2014 |

* cited by examiner

*Primary Examiner* — Asok K Sarkar
(74) *Attorney, Agent, or Firm* — Foley & Lardner LLP

(57) ABSTRACT

A method for manufacturing a semiconductor device includes bonding a supporting substrate and a first surface of a semiconductor substrate via a bonding layer, processing a second surface of the supporting substrate, opposite to the first surface, to shape the semiconductor substrate into a thin film. After shaping the semiconductor substrate into a thin film, polishing a part of the bonding layer formed at a beveled portion of the supporting substrate or the semiconductor substrate with a first polishing plane to remove the part of the bonding layera A33fter polishing the part of the bonding layer, polishing a remaining part of the bonding layer formed at the beveled portion of the supporting substrate or the semiconductor substrate with a second polishing plane different from the first polishing plane to remove the remaining part of the bonding layer.

13 Claims, 2 Drawing Sheets

METHOD FOR MANUFACTURING SEMICONDUCTOR DEVICE

CROSS-REFERENCE TO RELATED APPLICATION

This application is based upon and claims the benefit of priority from Japanese Patent Application No. 2018-099668, filed May 24, 2018, the entire contents of which are incorporated herein by reference.

FIELD

Embodiments described herein relate generally to a method for manufacturing a semiconductor device.

BACKGROUND

Processes for manufacturing a stacked-type semiconductor device using a back-side illumination-type complementary metal-oxide semiconductor (CMOS) sensor or a through-silicon via (TSV) include a manufacturing process of pasting a supporting substrate and a semiconductor substrate together via a bonding layer for the purpose of reducing the thickness of semiconductor substrates. While, at the time of pasting substrates together, the bonding layer may in some cases protrude to a beveled portion of the substrate. In a case where the bonding layer is made from an electrically conducting material, arcing may occur in the course of semiconductor manufacturing using plasma, such as dry etching, sputtering, or chemical vapor deposition (CVD), and may lead to substrate breaking.

DETAILED DESCRIPTION

Figure 1A:
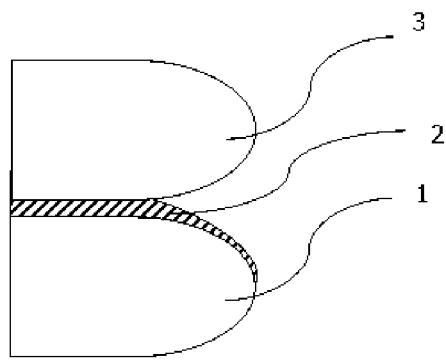
FIGS. 1A, 1B, 1C, and 1D are explanatory diagrams of a method for manufacturing a semiconductor device according to at least one embodiment.

At least one embodiment provides a method for manufacturing a semiconductor device with an increased reliability of substrate bonding.

In general, according to at least one embodiment, a method for manufacturing a semiconductor device includes bonding a supporting substrate and a first surface of a semiconductor substrate via a bonding layer, processing a second surface of the supporting substrate, opposite to the first surface, to shape the semiconductor substrate into a thin film, after shaping the semiconductor substrate into a thin film, polishing a part of the bonding layer formed at a beveled portion of the supporting substrate or the semiconductor substrate with a first polishing plane to remove the part of the bonding layer, and after polishing the part of the bonding layer, polishing a remaining part of the bonding layer formed at the beveled portion of the supporting substrate or the semiconductor substrate with a second polishing plane different from the first polishing plane to remove the remaining part of the bonding layer.

Hereinafter, embodiments for implementing the present disclosure will be described.

(Embodiment 1) A method for manufacturing a semiconductor device according to an embodiment 1 is described with reference to FIGS. 1A, 1B, 1C, and 1D. Furthermore, in the following description illustrated in the drawings, the same portions are denoted by the respective same reference characters. However, the drawings may be different from actual arrangement in, for example, the relationship and ratio between the thickness and the plane dimension, and are thus schematic drawings. FIGS. 1A to 1D are process sectional views illustrating the method for manufacturing a semiconductor device according to the at least one embodiment, and are diagrams illustrating an edge portion of a semiconductor substrate and nearby portions.

As illustrated in FIG. 1A, the method bonds a supporting substrate 1 and a semiconductor substrate 3 with a bonding layer 2. Specifically, first, the method prepares the supporting substrate 1, a chief material of which may be quartz glass or silicon. While a surface of the supporting substrate 1 facing the semiconductor substrate 3 (i.e., the obverse side of the supporting substrate 1) is flat, the lateral side of the supporting substrate 1 is not flat and has a convex shape toward the outside. Next, the method forms the bonding layer 2 on the supporting substrate 1 using the CVD method, coating method, or sputtering method, for example. The bonding layer 2 to be used is an ultraviolet (UV) curable resin such as an acrylic resin or a thermosetting resin. Moreover, the method brings the semiconductor substrate 3 into contact with the bonding layer 2 and irradiates the bonding layer 2 with ultraviolet light or heats the bonding layer 2, thus bonding the semiconductor substrate 3 onto the supporting substrate 1. The semiconductor substrate 3 has approximately the same size as that of the supporting substrate 1. The lateral side of the semiconductor substrate 3 is not flat, as with the supporting substrate 1, and has a convex shape toward the outside. The semiconductor substrate 3 is bonded in such a way as to cause a surface thereof on which a semiconductor element, such as a transistor, is formed to face the bonding layer 2. Furthermore, the supporting substrate 1 and the semiconductor substrate 3 maybe bonded by forming the bonding layer 2 not on the supporting substrate 1 but on the semiconductor substrate 3 and then bonding the semiconductor substrate 3 to the supporting substrate 1.

The bonding layer 2 may be in some cases formed at the beveled portion of the supporting substrate 1 in such a way as to protrude to the outside from the surface bonded to the semiconductor substrate 3. The bonding layer 2 may be formed while protruding to the outside of the flat surface of the supporting substrate 1, in other words, while protruding to the surface of a convex portion of the lateral side of the supporting substrate 1. The bonding layer 2 may vary in place of formation thereof according to a coating film formation condition onto the supporting substrate 1 or a pressing condition employed at the time of bonding of the semiconductor substrate 3. The bonding layer 2 may be in some cases formed not only on the beveled portion of the supporting substrate 1 but also on the surface of the beveled portion of the semiconductor substrate 3. In these cases, the bonding layer 2 is formed while protruding to the outside of the flat surface of the semiconductor substrate 3 facing the obverse side of the supporting substrate 1, in other words, while protruding to the surface of a convex portion of the lateral side of the semiconductor substrate 3.

Figure 1B:
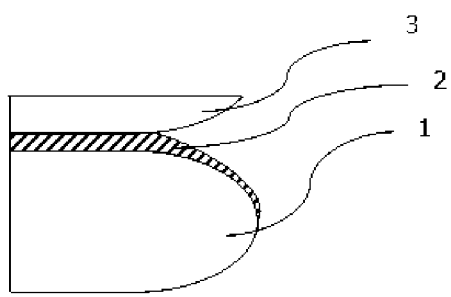

Next, as illustrated in FIG. 1B, the method mechanically polishes a surface of the semiconductor substrate 3 opposite to the surface thereof bonded to the bonding layer 2 (i.e., the reverse side of the semiconductor substrate 3) using, for example, trimming or a tape, thus shaping the semiconductor substrate 3 into a thin film. Here, shaping the semiconductor substrate 3 into a thin film causes a convex portion of the lateral side of the semiconductor substrate 3 to be sharpened and formed into what is called a knife-edge structure.

Figure 1C:
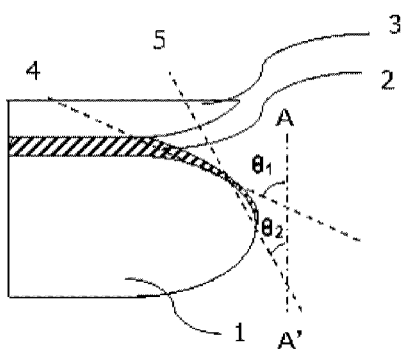

Next, the method polishes, in two stages, the bonding layer 2 protruding to the beveled portion of the supporting substrate 1 or the semiconductor substrate 3 with two polishing planes indicated by two dotted lines 4 and 5 illustrated in FIG. 1C, thus removing the protruding portion of the bonding layer 2. The beveled portion is an area extending from the lateral side of the substrate toward the center thereof by a predetermined distance, for example, about 0.5 mm. Here, an angle (i.e., the minor angle) $\theta_1$ between a direction A-A' perpendicular to the flat surface on which the supporting substrate 1 and the semiconductor substrate 3 face each other and the dotted line 4 is set larger than an angle (i.e., the minor angle) $\theta_2$ between the direction A-A' and the dotted line 5, so that, for example, the angle $\theta_1$ is set to greater than or equal to 50° and less than 90° and the angle $\theta_2$ is set to greater than 0° and less than or equal to 70°.

In first polishing, the method polishes a portion extending from the reverse side of the semiconductor substrate 3 to the supporting substrate 1 with the polishing plane indicated by the dotted line 4, thus gradually removing the bonding layer 2. In the first polishing, not only the bonding layer 2 but also parts of the semiconductor substrate 3 and the supporting substrate 1 are removed. While a portion of the bonding layer 2 protruding to the outside of the surface bonded to the semiconductor substrate 3 may be removed by the first polishing, in order to prevent a semiconductor element or a functional circuit from being damaged by excessive polishing of the semiconductor substrate 3, polishing needs to be stopped on the way. If, as the polishing angle (i.e., the minor angle) $\theta_1$ is large, it is intended to completely remove the bonding layer 2 by performing the first polishing, there is a possibility of damaging the semiconductor element or the functional circuit formed at the semiconductor substrate 3. Accordingly, after the first polishing, the bonding layer 2 remains unremoved at the beveled surface, in particular, the lateral side, of the supporting substrate 1.

Figure 1D:
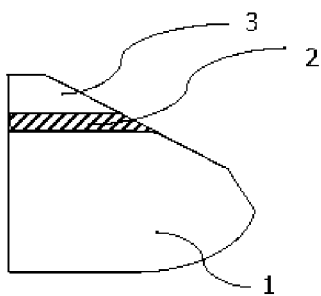

Therefore, the method removes, in second polishing, a portion of the bonding layer 2 remaining at the surface of the supporting substrate 1 after the first polishing. In the second polishing, the bonding layer 2 located on the beveled portion of the supporting substrate 1 is polished with the polishing plane indicated by the dotted line 5 and is thus removed. As illustrated in FIG. 1D, the method ends the second polishing at the time of completing a removal of the bonding layer 2. Here, since the angle (i.e., the minor angle) $\theta_2$ used at the time of the second polishing is smaller than the angle (i.e., the minor angle) $\theta_1$ used at the time of the first polishing, such excessive polishing as to polish the semiconductor element or the functional circuit formed on the semiconductor substrate 3 is not performed in the second polishing, so that they can be prevented from being damaged. According to the method for manufacturing a semiconductor device in at least one embodiment, the bonding layer 2 protruding from the surface on which the supporting substrate 1 and the semiconductor substrate 3 are bonded to each other can be polished and removed while the semiconductor element provided on the semiconductor substrate 3 is prevented from being damaged. Arcing which occurs due to the bonding layer 2 remaining at the beveled portion can be prevented.

Moreover, while, according to the method for manufacturing a semiconductor device in at least one embodiment, the second polishing is performed after the first polishing performed, this order can be reversed, so that, after performing the second polishing to partially remove the bonding layer 2 at the surface of the beveled end portion of the supporting substrate 1 or the semiconductor substrate 3, the method can perform the first polishing to remove the bonding layer 2 remaining at the beveled surface of the supporting substrate 1 or the semiconductor substrate 3.

Embodiment 2) Next, a method for manufacturing a semiconductor device according to at least another embodiment 2 is described with reference to FIGS. 2A and 2B and FIG. 3. Furthermore, in the following description illustrated in the drawings, the same portions are denoted by the respective same reference characters. However, the drawings may be different from the actual arrangement in, for example, the relationship and ratio between the thickness and the plane dimension, and are thus schematic ones.

Figure 2A:
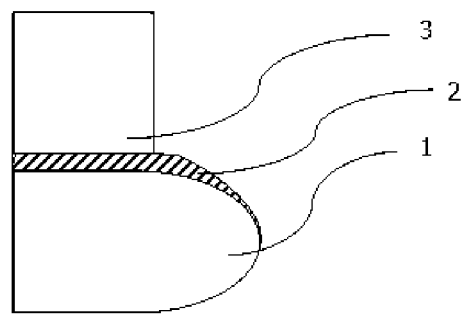
FIGS. 2A and 2B are explanatory diagrams of a method for manufacturing a semiconductor device according to at least one embodiment.
Figure 2B:
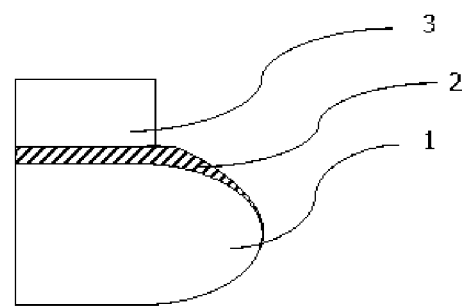
Figure 3:
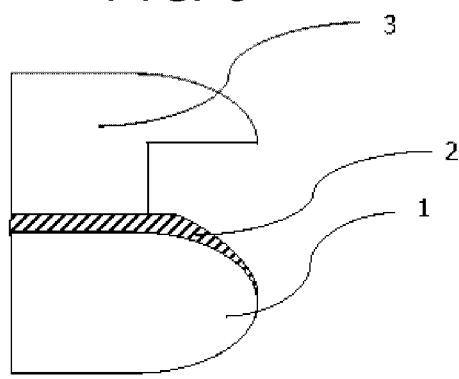
FIG. 3 is an explanatory diagram of the method for manufacturing a semiconductor device according to at least one embodiment.

FIGS. 2A and 2B are process sectional views illustrating the method for manufacturing a semiconductor device according to the embodiment 2 and are diagrams illustrating an edge portion of a semiconductor substrate and nearby portions. The method for manufacturing a semiconductor device according to the embodiment 2 differs from the method for manufacturing a semiconductor device according to the embodiment 1 in that, to avoid the knife-edge structure of the semiconductor substrate illustrated in FIG. 1B in the embodiment 1, the method cuts or trims the beveled portion of the semiconductor substrate prior to the process of polishing of the bonding layer. The rest of feature points is similar and is, therefore, omitted from description.

In the method for manufacturing a semiconductor device according to at least one embodiment, after bonding the supporting substrate 1 and the semiconductor substrate 3 with the bonding layer 2 as illustrated in FIG. 1A, the method cuts the beveled portion of the semiconductor substrate 3 using, for example, a dicing blade, thus removing the beveled portion, as illustrated in FIG. 2A. The portion to be cut is a beveled portion located outside the region in which the semiconductor substrate 3 is bonded to the bonding layer 2 and is, for example, an area extending from the lateral side of the semiconductor substrate toward the center of the substrate by 400 µm or more. Furthermore, as long as a semiconductor element or a functional circuit forming portion is prevented from being cut, the method may cut up to an area on the surface on which the semiconductor substrate 3 is bonded to the bonding layer 2.

Next, as illustrated in FIG. 2B, the method polishes the semiconductor substrate 3 from the reverse surface of the semiconductor substrate 3, thus shaping the semiconductor substrate 3 into a thin film. In at least one embodiment, the edge portion of the semiconductor substrate 3 is not sharpened and is not processed into the knife-edge structure. In the method described in the embodiment 1, the thickness of the edge portion of the semiconductor substrate 3 becomes smaller with back surface polishing, so that the edge portion of the semiconductor substrate 3 is sharpened. Since the sharpened edge portion decreases in mechanical strength, in a subsequent polishing process for the bonding layer 2, a polishing pressure being applied to the sharpened edge portion may cause a crack, so that the edge portion may be chipped. Chipped pieces of the edge portion of the semiconductor substrate coming into contact with the bonding layer 2 or the semiconductor element or the functional circuit provided on the semiconductor substrate 3 may induce damages. Moreover, chipped pieces of the edge portion may cause arcing.

On the other hand, in the method for manufacturing a semiconductor device according to at least one embodiment, the beveled portion of the semiconductor substrate 3, in particular, a convex portion of the lateral side of the semiconductor substrate 3, is cut prior to back surface polishing. Therefore, the edge portion of the semiconductor substrate 3 can be prevented from being cracked or chipped during polishing of the bonding layer. Subsequent manufacturing processes are similar to those of the method for manufacturing a semiconductor device according to the embodiment 1, and, as illustrated in FIGS. 1C and 1D, the method performs two-stage polishing with respective different polishing planes, thus removing the bonding layer 2. Furthermore, while, in FIG. 2A, the method cuts the entire convex portion of the lateral side of the semiconductor substrate 3, as illustrated in FIG. 3, the method may trim only a part, close to the bonding layer 2, of the convex portion of the lateral side of the semiconductor substrate 3 with, for example, a polishing tape. In other words, the method may trim a partial area extending from the lower surface close to the bonding layer to an upper portion by a predetermined distance in the beveled portion of the semiconductor substrate 3. Then, when shaping the semiconductor substrate 3 into a thin film by back surface polishing as illustrated in FIG. 2B, the method removes the convex portion remaining at the lateral side of the semiconductor substrate 3. This enables polishing and removing the bonding layer 2 while removing the knife-edge structure of the semiconductor substrate 3, so that the edge portion of the semiconductor substrate 3 can be prevented from being cracked or chipped.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. A method for manufacturing a semiconductor device, the method comprising:
    bonding a supporting substrate and a first surface of a semiconductor substrate via a bonding layer;
    processing a second surface of the supporting substrate, opposite to the first surface, to shape the semiconductor substrate into a thin film;
    after shaping the semiconductor substrate into a thin film, polishing a part of the bonding layer formed at a beveled portion of the supporting substrate or the semiconductor substrate with a first polishing plane to remove the part of the bonding layer; and
    after polishing the part of the bonding layer, polishing a remaining part of the bonding layer formed at the beveled portion of the supporting substrate or the semiconductor substrate with a second polishing plane different from the first polishing plane to remove the remaining part of the bonding layer,
    wherein a first minor angle between a direction perpendicular to the first surface of the semiconductor substrate and the first polishing plane is different from a second minor angle between the direction perpendicular to the first surface of the semiconductor substrate and the second polishing plane.

2. The method for manufacturing a semiconductor device according to claim 1, further comprising removing at least a part of a convex portion of a lateral side of the semiconductor substrate prior to shaping the semiconductor substrate into a thin film.

3. The method for manufacturing a semiconductor device according to claim 2, wherein the first minor angle is larger than the second minor angle.

4. The method for manufacturing a semiconductor device according to claim 2, wherein the at least a part of a convex portion of a lateral side of the semiconductor substrate is removed using a dicing blade.

5. The method for manufacturing a semiconductor device according to claim 1, wherein the first minor angle is larger than the second minor angle.

6. The method for manufacturing a semiconductor device according to claim 5, wherein the first minor angle is greater than or equal to 50° and less than 90°.

7. The method for manufacturing a semiconductor device according to claim 6, wherein the second minor angle is greater than 0° and less than or equal to 70°.

8. The method for manufacturing a semiconductor device according to claim 5, wherein the second minor angle is greater than 0° and less than or equal to 70°.

9. The method for manufacturing a semiconductor device according to claim 1, wherein the bonding layer is at least one of a UV curable resin or a thermosetting resin.

10. The method for manufacturing a semiconductor device according to claim 1, wherein the bonding layer is bonded to the semiconductor substrate prior to being bonded to the support substrate.

11. The method for manufacturing a semiconductor device according to claim 1, wherein the bonding layer is bonded to the support substrate prior to being bonded to the semiconductor substrate.

12. The method for manufacturing a semiconductor device according to claim 1, wherein the first minor angle is smaller than the second minor angle.

13. The method for manufacturing a semiconductor device according to claim 1, wherein the processing the second surface of the supporting substrate includes polishing the second surface of the supporting substrate.

* * * * *